(12) United States Patent
Matsumoto et al.

(10) Patent No.: US 11,342,724 B2
(45) Date of Patent: May 24, 2022

(54) SEMICONDUCTOR OPTICAL INTEGRATED DEVICE

(71) Applicant: Mitsubishi Electric Corporation, Tokyo (JP)

(72) Inventors: Keisuke Matsumoto, Tokyo (JP); Eitaro Ishimura, Tokyo (JP); Satoshi Kajiya, Tokyo (JP); Satoshi Nishikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/965,621

(22) PCT Filed: Apr. 23, 2018

(86) PCT No.: PCT/JP2018/016437
§ 371 (c)(1),
(2) Date: Jul. 29, 2020

(87) PCT Pub. No.: WO2019/207624
PCT Pub. Date: Oct. 31, 2019

(65) Prior Publication Data
US 2021/0044082 A1    Feb. 11, 2021

(51) Int. Cl.
    *H01S 5/02*      (2006.01)
    *H01S 5/026*     (2006.01)
    *H01S 5/50*      (2006.01)

(52) U.S. Cl.
    CPC .......... *H01S 5/0208* (2013.01); *H01S 5/0265* (2013.01); *H01S 5/50* (2013.01)

(58) Field of Classification Search
    CPC ......... H01S 5/50; H01S 5/0208; H01S 5/4018
    (Continued)

(56) References Cited

FOREIGN PATENT DOCUMENTS

| | | | |
|---|---|---|---|
| JP | 2013258336 A | 12/2013 | |
| WO | 2007107782 A1 | 9/2007 | |
| WO | WO-2007107782 A1 * | 9/2007 | ......... H01S 5/04256 |

OTHER PUBLICATIONS

International Search Report issued in PCT/JP2018/016437; dated Jul. 10, 2018.

(Continued)

*Primary Examiner* — Tuan N Nguyen
(74) *Attorney, Agent, or Firm* — Studebaker & Brackett PC

(57) ABSTRACT

A semiconductor optical integrated device comprises a semiconductor amplifier and a plurality of semiconductor lasers, wherein the semiconductor amplifier and the semiconductor lasers are monolithically integrated on a semiconductor substrate, an n-side cladding layer of the semiconductor amplifier and an n-side cladding layer of each of the semiconductor lasers are electrically insulated by an insulating layer formed between the semiconductor substrate and the n-side cladding layer of the semiconductor lasers and an insulating layer formed between the n-side cladding layer of the semiconductor amplifier and the n-side cladding layer of the semiconductor lasers, the n-side cladding layer of the semiconductor lasers and the p-side cladding layer of the semiconductor amplifier is configured to be electrically connected, and the semiconductor amplifier and each semiconductor laser of the plurality of semiconductor lasers are electrically connected in series.

5 Claims, 22 Drawing Sheets

(58) Field of Classification Search
USPC .......................................................... 372/50.1
See application file for complete search history.

(56) References Cited

OTHER PUBLICATIONS

An Office Action mailed by China National Intellectual Property Administration dated Jan. 6, 2022, which corresponds to Chinese Patent Application No. 201880092469.9 and is related to U.S. Appl. No. 16/965,621; with English language translation.

* cited by examiner

STEP 1

STEP 2

STEP 3

STEP 4

STEP 5

STEP 6

STEP 7

STEP 8

STEP 9

STEP 10

STEP 11

STEP 12

STEP 13

STEP 14

STEP 15

STEP 16

STEP 17

STEP 18

STEP 21

STEP 22

STEP 23

STEP 24

STEP 25

STEP 26

STEP 27

STEP 28

STEP 31

STEP 32

STEP 33

STEP 34

SEMICONDUCTOR OPTICAL INTEGRATED DEVICE

TECHNICAL FIELD

The present application relates to a semiconductor optical integrated device in which semiconductor optical devices are integrated.

BACKGROUND ART

In the access network system, which is an optical communication system between a relay station and a user, a directly modulated semiconductor laser transmitter (DML transmitter) suitable for low-speed modulation has been conventionally used in many cases. However, in a case where high-speed communication of 10 Gb/s or more is performed, an electro-absorption modulator integrated laser (EML) in which an electro-absorption type semiconductor optical modulator (EAM) suitable for high-speed modulation and a distributed feedback laser diode (DFB-LD, sometimes referred to as LD for simplicity) are integrated to be a semiconductor optical integrated device is suitable. In the access network system, the signal light intensity is attenuated because the optical signal is split for a plurality of users. Therefore, there has been a problem in that the output of the semiconductor laser transmitter before splitting needs to be increased.

Since the EAM, which is an external modulator, has an insertion loss, it is necessary to increase the drive current of the LD to increase the optical output in order to increase the EML output. However, there are problems such as limitation of the increase in the optical output of the LD, the increase in the power consumption of the LD and the temperature control device, and deterioration of the extinction characteristic of EAM with the increase in the optical input to the EAM. Thus, it is not easy to increase the EML output. With regard to the problems, in Patent Document 1, a semiconductor optical amplifier (SOA) is monolithically integrated on the same substrate on an EAM emission side of a device in which an LD and the EAM are integrated, forming a semiconductor optical integrated device, and thereby high output power is achieved. In addition, by adopting a structure in which the LD and the SOA are powered through one terminal, the same power supply method as that for a device with a structure that does not integrate the SOA is maintained. Thus, influence due to the change in the device structure, on the drive circuit of the semiconductor laser transmitter, can be reduced.

In the SOA driven by a constant current, when input light is increased, carriers in an active layer is consumed by the recombination and the carrier density is reduced, so that the gain fluctuates. The fluctuation in the carrier density becomes more pronounced on the SOA emission side in which the light intensity becomes larger, and also as the SOA becomes longer in size. In this way, the fluctuation in the carrier density occurs depending on the intensity of the modulated signal light incident on the SOA and its waveform pattern, and waveform degradation occurs owing to the gain fluctuation (i.e., pattern effect). The pattern effect becomes more pronounced as the modulation speed of the signal light increases, and in the case of a semiconductor laser transmitter integrated with the SOA, the pattern effect affects the transmitter when the modulation speed is 10 Gb/s or more. The response speed of the SOA is the carrier density recovery speed of the active layer, which is affected by the drive current of the SOA.

CITATION LIST

Patent Document

Patent Document 1: JP2013-258336A
Patent Document 2: US 2004/0042069A1

SUMMARY OF INVENTION

Technical Problem

As described in Patent Document 1, in the semiconductor optical integrated device in which an LD, an EAM, and an SOA are integrated in this order, when the LD and the SOA are connected and driven through the same terminal, a common drive voltage is applied to the LD and the SOA, and the total drive current is divided depending on an internal resistance ratio proportional to a ratio of the LD and the SOA in their length and is supplied. The current value required at this time is the sum of the current values supplied to the LD and the SOA. For example, in order to obtain a sufficient optical output in the case of a typical device in which the LD and the SOA have the same length, when the applied voltage is about 1.5 V, current of about 100 mA flows in both the LD and the SOA, and the total current of about 200 mA is required. However, in general, in a small-sized driver IC for driving a device within a semiconductor optical integrated device, it is possible to supply a voltage of 3 V or more, but there is a limit to the supply current.

In order to reduce the supply current, a series connection is effective, and Patent Document 2 discloses a technique of driving the LD and the SOA by connecting them in series. However, the configuration described in Patent Document 2 is such that the LD and the SOA are mounted on a submount substrate, and thus the technique cannot be directly applied to a configuration in which the LD and the SOA are monolithically integrated on a semiconductor substrate.

The present application is to disclose a technique to solve a problem described above, and an object is such that, in a semiconductor optical integrated device in which optical devices are integrated on a semiconductor substrate, the optical devices can be connected in series, the drive current from a power supply is small, and a high output semiconductor optical integrated device can be provided.

Solution to Problem

A semiconductor optical integrated device disclosed in the present application includes a semiconductor amplifier and a plurality of semiconductor lasers that are monolithically integrated on one surface of the same semiconductor substrate, and are configured such that holes are injected from a p-side cladding layer and electrons are injected from a n-side cladding layer into an active layer, wherein the semiconductor substrate is a conductive semiconductor substrate;

the n-side cladding layer of the semiconductor amplifier and the n-side cladding layer of each of the plurality of semiconductor lasers are electrically insulated by a first electrically insulating layer formed between the semiconductor substrate and the n-side cladding layer of each of the plurality of semiconductor lasers and a second electrically insulating layer formed between the n-side cladding layer of the semiconductor amplifier and the n-side cladding layer of each of the plurality of semiconductor lasers;

an n-side contact layer for electrically connecting to the n-side cladding layer of each of the plurality of semiconductor lasers is provided between the n-side cladding layer of each of the plurality of semiconductor lasers and the first electrically insulating layer;

the n-side contact layer and the p-side cladding layer of the semiconductor amplifier is configured to be electrically connected; and the semiconductor amplifier and each semiconductor laser of the plurality of semiconductor lasers are electrically connected in series.

Advantageous Effects of Invention

According to the semiconductor optical integrated device disclosed in the present application in which optical devices are integrated on a semiconductor substrate, an advantageous effect is that optical devices can be connected in series, the drive current from a power supply is small, and a high output semiconductor optical integrated device can be provided.

DESCRIPTION OF EMBODIMENTS

Embodiment 1

Figure 1:
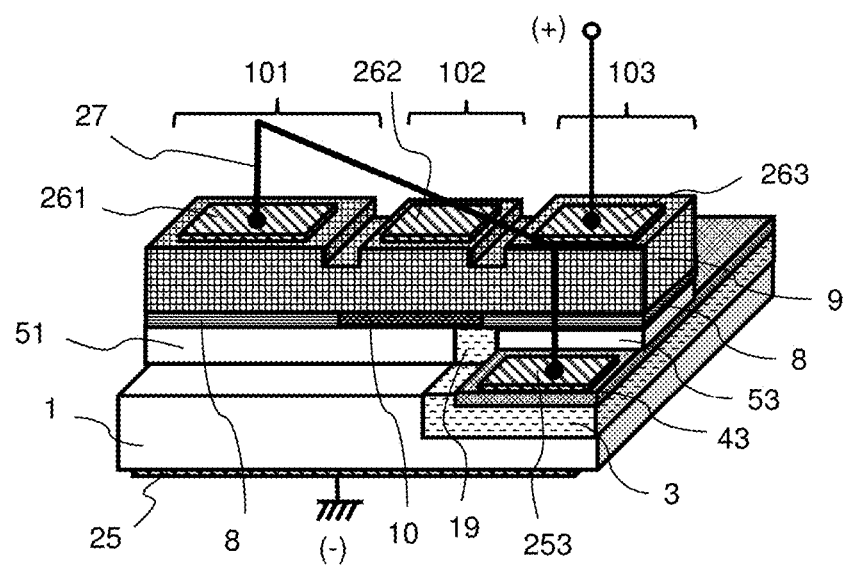
FIG. 1 is a conceptual diagram showing a configuration of a main part of a semiconductor optical integrated device according to Embodiment 1.

FIG. 1 is a conceptual diagram showing a configuration of a main part of a semiconductor optical integrated device according to Embodiment 1. In this semiconductor optical integrated device, a semiconductor laser (LD) 101, an electro-absorption type semiconductor optical modulator (Simply referred to as a modulator or EAM) 102, and a semiconductor optical amplifier (SOA) 103 are integrated on the same semiconductor substrate 1 (n-InP substrate). As for the dimension of each device, for example, the semiconductor laser is 300 μm in length, the semiconductor optical amplifier is 150 μm in length, and the modulator is 200 μm in length.

The semiconductor laser 101 is constituted with, as main members, an n-InP cladding layer 51 as an n-side cladding layer, an active layer 8, and a p-InP cladding layer 9 as a p-side cladding layer, which are sequentially formed on an n-InP substrate 1 as a conductive semiconductor substrate.

The modulator 102 is constituted with the n-InP cladding layer 51, a modulator absorption layer 10, and the p-InP cladding layer 9, which are formed sequentially on the n-InP substrate 1. Basically as in the case of the semiconductor laser 101, the semiconductor optical amplifier 103 is constituted with an n-InP cladding layer 53 as the n-side cladding layer, the active layer 8, and the p-InP cladding layer 9 as the p-side cladding layer, which are sequentially formed on the n-InP substrate 1. In the semiconductor optical integrated device according to Embodiment 1, an Fe-doped semi-insulating InP layer 3 as serving an electrically insulating layer is provided between the n-InP substrate 1 and the n-InP cladding layer 53 that are in the region of the semiconductor optical amplifier 103 for electrical insulation, and further, a conductive n-InGaAsP contact layer 43 as an n-side contact layer is provided between the Fe-doped semi-insulating InP layer 3 and the n-InP cladding layer 53. Further, an Fe-doped semi-insulating InP layer 19 serving as an electrically insulating layer is provided between the n-InP cladding layer 51 in regions of the semiconductor laser 101 and the modulator 102 and the n-InP cladding layer 53 in the region of the semiconductor optical amplifier 103, so that the n-side cladding layer 51 of the semiconductor laser 101 is electrically insulated from the n-side cladding layer 53 of the semiconductor optical amplifier 103. Note that an insulating material applicable to the semiconductor optical integrated device disclosed in the present application is not an insulating material such as quartz or ceramic, but a semiconductor material, and is referred to as a "semi-insulating property" because it is a material having a sufficiently high resistivity so as not to allow current to flow in contrast to a material through which current flows within materials constituting the device. In the p-side cladding layer 9, the isolation resistance of about three orders of magnitude higher than that of the n-side can be obtained only by etching an isolation region between the devices, and therefore, it is not necessary to fill a gap between the modulator 102 and the semiconductor optical amplifier 103 and a gap between the semiconductor laser 101 and the modulator 102 especially with a semi-insulating material.

Further, in order to allow electrical connection to the outside or between the devices, a p-side contact electrode 261 is formed on the p-side cladding layer 9 in the region of the semiconductor laser 101, a p-side contact electrode 262 is formed on the p-side cladding layer 9 in the region of the modulator 102, and a p-side contact electrode 263 is formed on the p-side cladding layer 9 in the region of the semiconductor optical amplifier 103. An n-side contact electrode 25 is formed on the rear surface of the n-InP substrate 1. The n-InGaAsP contact layer 43 that is an n-side contact layer provided under the n-side cladding layer 53 of the semiconductor optical amplifier 103 extends laterally (lateral direction perpendicular to the optical axis of the laser) from the n-side cladding layer 53, and the n-side contact electrode 253 is provided on the upper surface of the extended n-side contact layer 43.

In the semiconductor laser 101 and the semiconductor optical amplifier 103, when current flows from the p-side cladding layer toward the n-side cladding layer, holes from the p-side cladding layer and electrons from the n-side cladding layer are injected into the active layer, and light is generated when the holes and the electrons are recombined in the active layer. In this semiconductor optical integrated device, the light emitted from the semiconductor laser 101 is input to the modulator 102. In the modulator 102, the amount of absorption of light is changed owing to an electric field applied in the reverse direction to the multi quantum well (MQW) being the modulator absorption layer 10. In the modulator 102, the light output can be modulated in such a way that the light is transmitted when the electric field is not applied and the light is absorbed and is not transmitted when the electric field is applied. The light transmitted through the modulator 102 is input to the semiconductor optical amplifier 103. In the semiconductor optical amplifier 103, the light is amplified in accordance with a value of the current injected into the semiconductor optical amplifier 103 and outputted.

Figure 2:
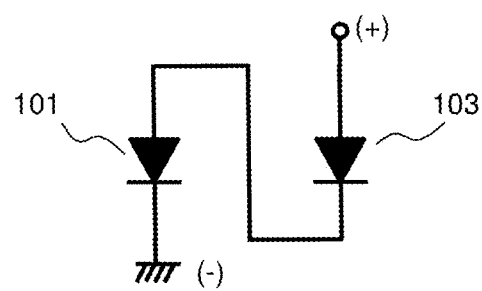
FIG. 2 is an equivalent circuit diagram for explaining an electrical connection of the semiconductor optical integrated device according to Embodiment 1.

An electrical connection of the semiconductor optical integrated device of FIG. 1 will be described. A DC voltage is applied from an external DC power supply (not shown) between the p-side contact electrode 263 of the semiconductor optical amplifier 103 and the n-side contact electrode 25 provided on the rear surface of the n-InP substrate 1. The n-side contact electrode 253 of the semiconductor optical amplifier 103 and the p-side contact electrode 261 of the semiconductor laser 101 are connected by a conductor such as a wire 27. With the connection described above, as shown in the equivalent circuit of FIG. 2, the semiconductor laser 101 and the semiconductor optical amplifier 103 are connected in series, and current of the same value flows through the semiconductor laser 101 and the semiconductor optical amplifier 103. Note that a signal voltage for the modulation is applied to the p-side contact electrode 262 of the modulator 102.

In the conventional semiconductor optical integrated device in which a semiconductor laser and a semiconductor optical amplifier are integrated on a semiconductor substrate, the semiconductor laser and the semiconductor optical amplifier cannot be electrically connected in series because the electrode on the n side is common as shown in Patent Document 1. In contrast, in the configuration of the semiconductor optical integrated device according to Embodiment 1, the n-side cladding layer 51 of the semiconductor laser 101 and the n-side cladding layer 53 of the semiconductor optical amplifier 103 are electrically insulated from each other, and the n-side cladding layer 53 of the semiconductor optical amplifier 103 and the n-side contact electrode 25 are electrically insulated from each other. Further, the n-side contact layer 43 for the electrical connection to the n-side cladding layer 53 in the region of the semiconductor optical amplifier 103 is provided so as to be extended laterally, and the n-side contact electrode 253 is provided on the upper surface of the n-side contact layer 43. With this configuration, the p-side cladding layer of the semiconductor laser 101 and the n-side cladding layer 53 of the semiconductor optical amplifier 103 can be electrically connected, and the semiconductor laser 101 and the semiconductor optical amplifier 103 can be electrically connected in series.

Figure 3A:
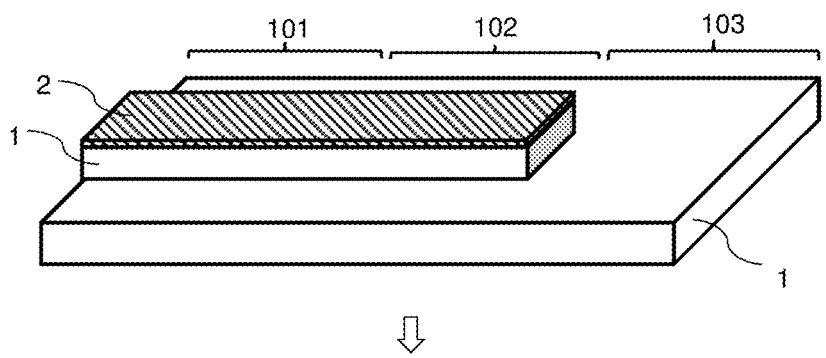
FIGS. 3A and 3B respectively illustrate Step 1 and Step 2 in semiconductor optical integrated device manufacturing processes according to Embodiment 1.

Next, a method of manufacturing a semiconductor optical integrated device according to Embodiment 1 will be described. FIGS. 3A and B to FIGS. 11A and B illustrate manufacturing processes. Note that the detailed structure and manufacturing processes of the semiconductor optical integrated device applicable to the present application are not limited to the following.

Figure 3B:
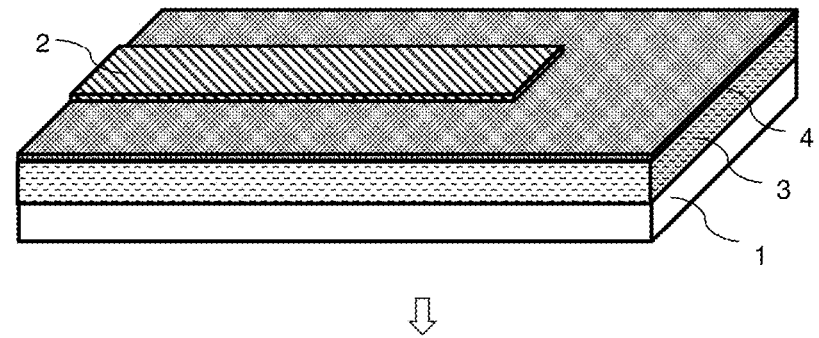
Figure 4A:
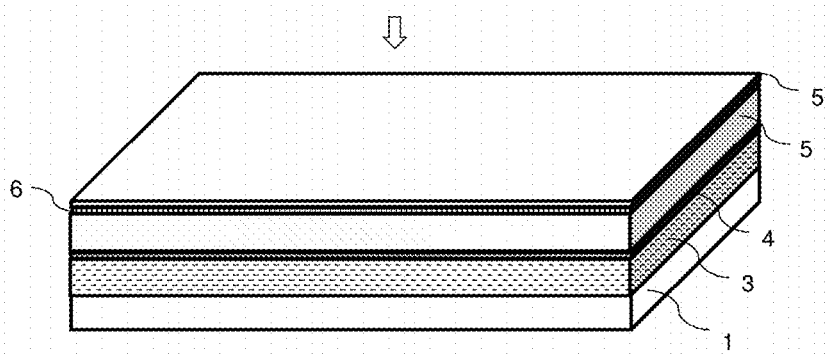
FIGS. 4A and 4B respectively illustrate Step 3 and Step 4 in the semiconductor optical integrated device manufacturing processes according to Embodiment 1.
Figure 4B:
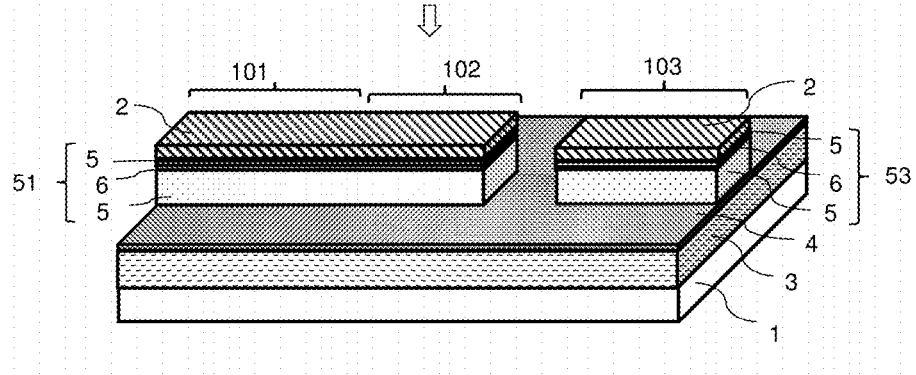

As shown in FIG. 3A, the n-InP substrate 1 being a conductive semiconductor substrate is covered with an insulating film 2 having a width of several tens of μm in the region of the semiconductor laser 101 and the modulator 102, and the n-InP substrate 1 is etched by several μm (Step 1). Thereafter, as shown in FIG. 3B, the Fe-doped semi-insulating InP layer 3 and an n-InGaAsP contact layer 4 are selectively grown (Step 2). The insulating film 2 is removed, and as shown in FIG. 4A, an n-InP cladding layer 5, an n-InGaAsP diffraction grating layer 6, and the n-InP cladding layer 5 are grown on the entire surface (Step 3). Next, as shown in FIG. 4B, the insulating film 2 is formed with a width of several tens of μm and with an opening of several tens of μm between the modulator 102 and the semiconductor optical amplifier 103, and is etched away until the n-InGaAsP contact layer 4 is exposed (Step 4). After the etching, the n-InP cladding layer 5, the n-InGaAsP diffraction grating layer 6, and the n-InP cladding layer 5 in the region of the semiconductor optical amplifier 103 are completed as the n-side cladding layer 53 at this stage. The n-InP cladding layer 5, the n-InGaAsP diffraction grating layer 6, and the n-InP cladding layer 5 in the region of the semiconductor laser 101 are completed as the n-side cladding layer 51 at the stage where the n-InGaAsP diffraction grating layer 6 in Step 7 described later is formed as a diffraction grating.

Figures 5A, 5B:
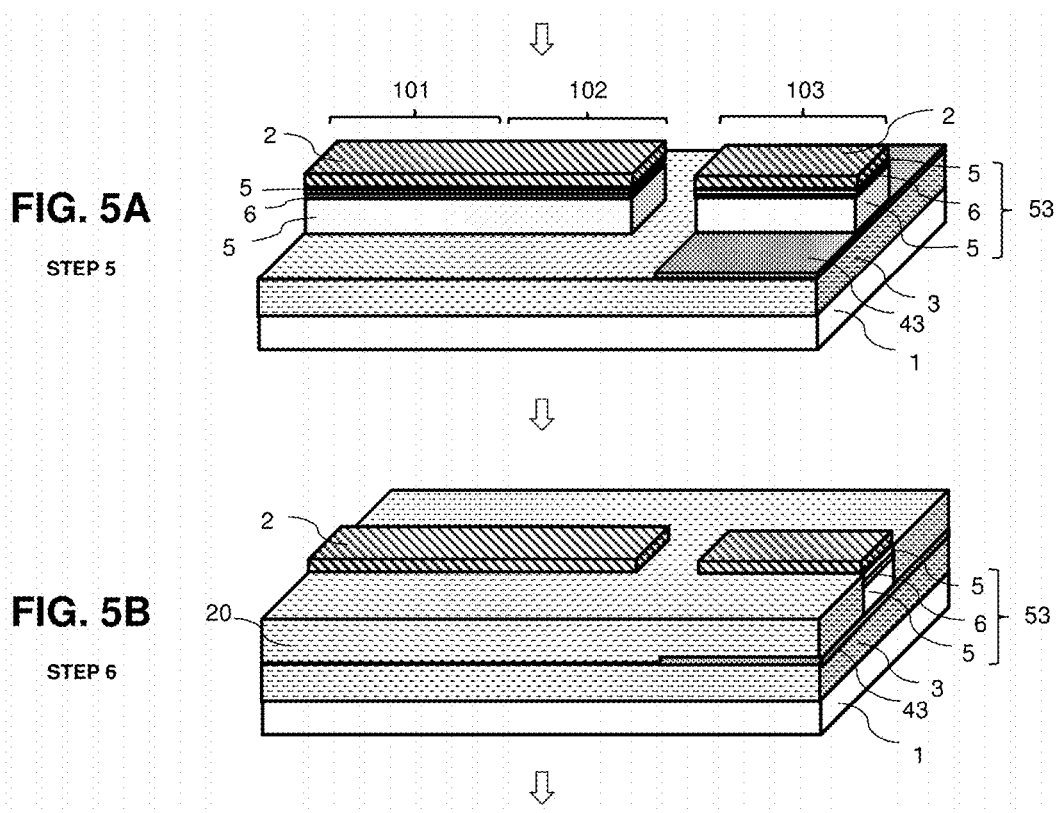
FIGS. 5A and 5B respectively illustrate Step 5 and Step 6 in the semiconductor optical integrated device manufacturing processes according to Embodiment 1.
Figure 6A:
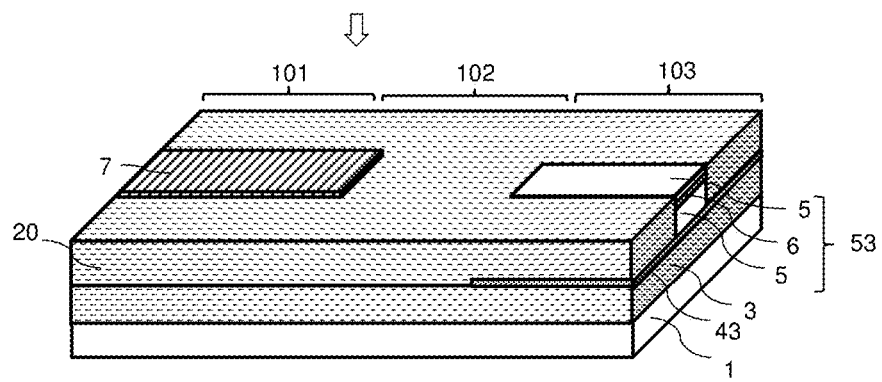
FIGS. 6A and 6B respectively illustrate Step 7 and Step 8 in the semiconductor optical integrated device manufacturing processes according to Embodiment 1.
Figure 6B:
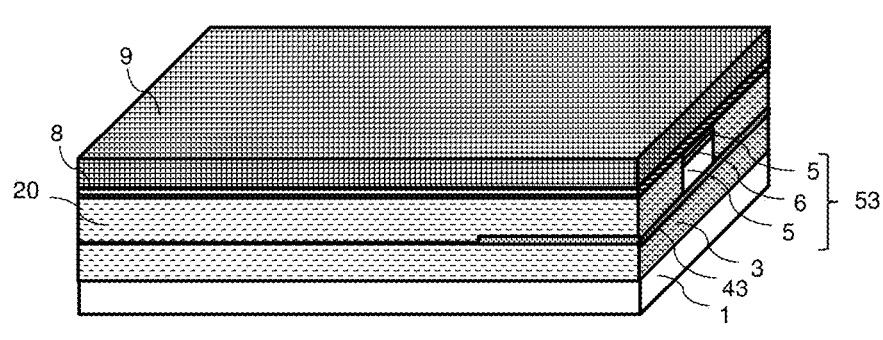

Further, as shown in FIG. 5A, the n-InGaAsP contact layer 4 in the portion except for the region of the semiconductor optical amplifier 103 is etched away, thereby forming the n-side contact layer 4 as the n-side contact layer 43 (Step 5). Then, as shown in FIG. 5B, an Fe-doped semi-insulating InP layer 20 is grown using the insulating film 2 as a mask (Step 6). Then, the insulating film 2 is removed, and as shown in FIG. 6A, the n-InGaAsP diffraction grating layer 6 in a diffraction grating region 7 of the semiconductor laser 101 is etched at a period of 200 nm to form the diffraction grating of the semiconductor laser (Step 7). After the above, as shown in FIG. 6B, the active layer 8 and the p-InP cladding layer 9 are formed (Step 8).

Figure 7A:
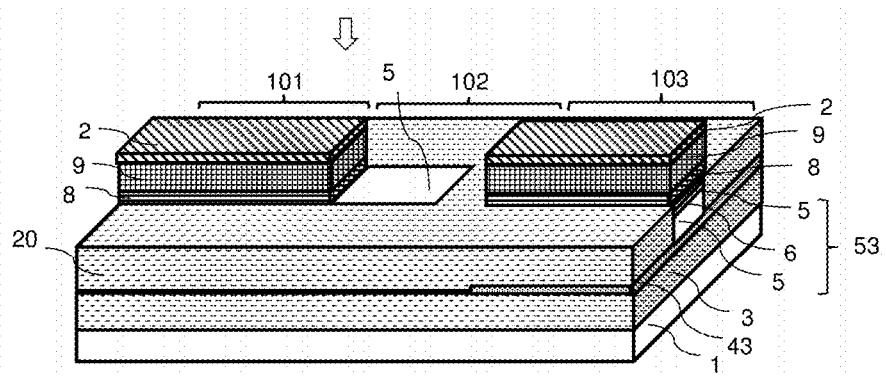
FIGS. 7A and 7B respectively illustrate Step 9 and Step 10 in the semiconductor optical integrated device manufacturing processes according to Embodiment 1.
Figure 7B:
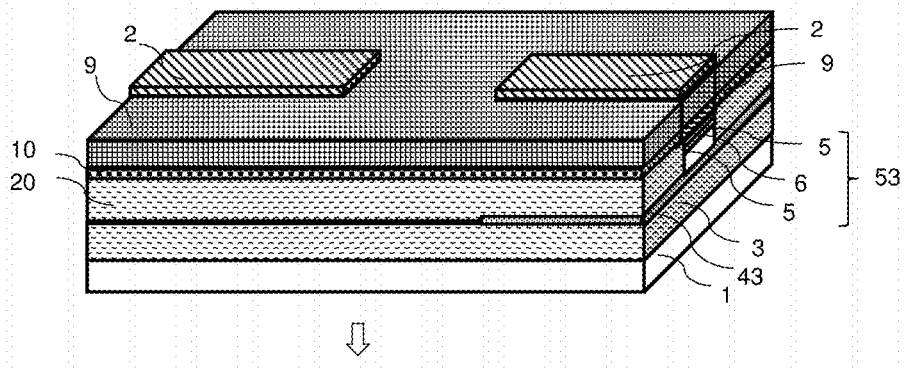
Figure 8A:
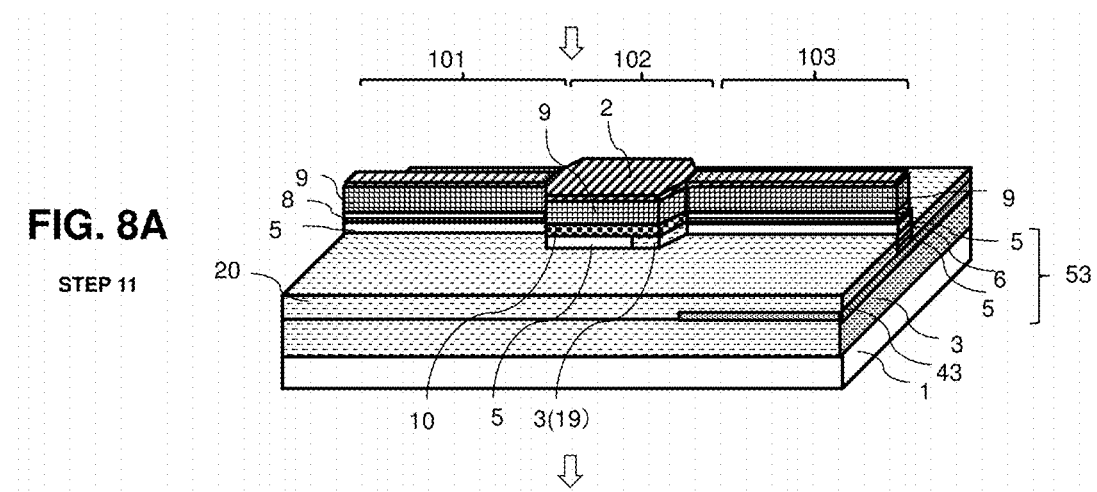
FIGS. 8A and 8B respectively illustrate Step 11 and Step 12 in the semiconductor optical integrated device manufacturing processes according to Embodiment 1.
Figure 8B:
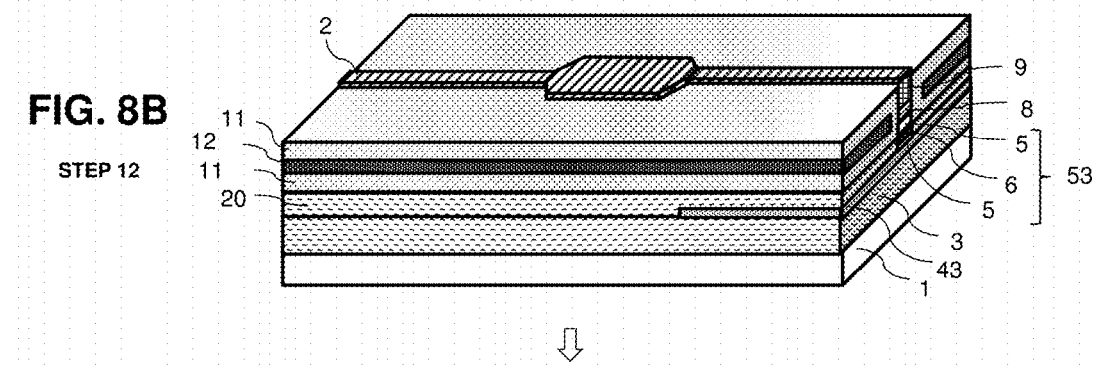

Next, as shown in FIG. 7A, the insulating film 2 with a width of several tens of μm is formed so as to have its opening in the region of the modulator 102, and the p-InP cladding layer 9 and the active layer 8 are etched (Step 9). Then, as shown in FIG. 7B, the modulator absorption layer 10 and the p-InP cladding layer 9 are selectively grown on the entire surface (Step 10). Then, the insulating film 2 is removed, and the insulating film 2 is formed again as shown in FIG. 8A, thereby forming a pattern for processing waveguides (Step 11). In the regions of the semiconductor laser 101 and the semiconductor optical amplifier 103 in which both sides of each waveguide are embedded with a semiconductor to form an embedded wave guide, the insulating film 2 at this stage has about 1 μm in width, and in the region of the modulator 102 in which the waveguide is formed in shape without covering both side of the waveguide with a semiconductor, the insulating film is formed to have about several tens of μm in width. Then, etching is performed so as to stop in the middle of the Fe-doped semi-insulating InP layer 20. After the above, as shown in FIG. 8B, a p-InP embedded layer 11, an n-InP embedded layer 12, and the p-InP embedded layer 11 are embedded and grown using the insulating film 2 as a mask (Step 12).

Figure 9A:
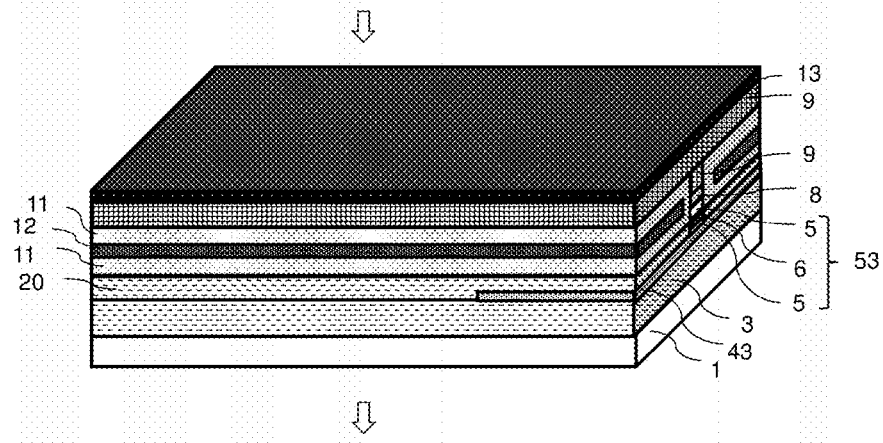
FIGS. 9A and 9B respectively illustrate Step 13 and Step 14 in the semiconductor optical integrated device manufacturing processes according to Embodiment 1.
Figure 9B:
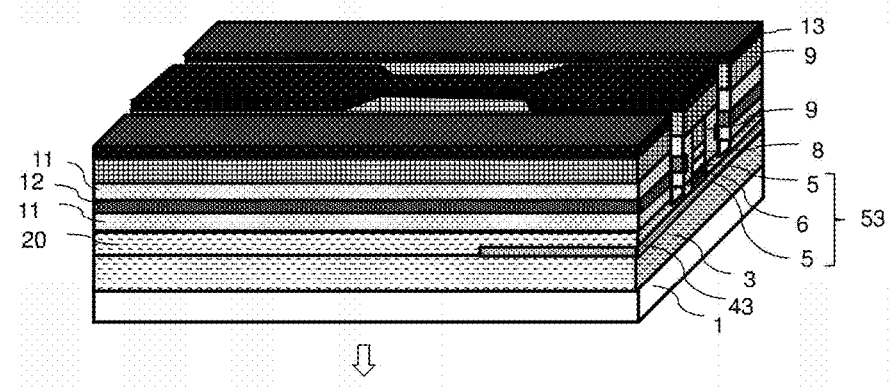

Then, the insulating film 2 is removed, and as shown in FIG. 9A, the p-InP cladding layer 9 and a p-InGaAs contact layer 13 are grown on the entire surface (Step 13). As shown in FIG. 9B, a mesa having about several tens of μm in width is formed in the regions of the semiconductor laser 101 and the semiconductor optical amplifier 103 in which both sides of each waveguide are embedded with a semiconductor to form an embedded wave guide, and a mesa having about 1 μm in width is formed in the region of the modulator 102 in which the waveguide is formed in shape without covering both sides of the waveguide with a semiconductor. Etching with regard to the depth of the mesa is performed so as to stop in the middle of the Fe-doped semi-insulating InP layer 20 (Step 14).

Figure 10A:
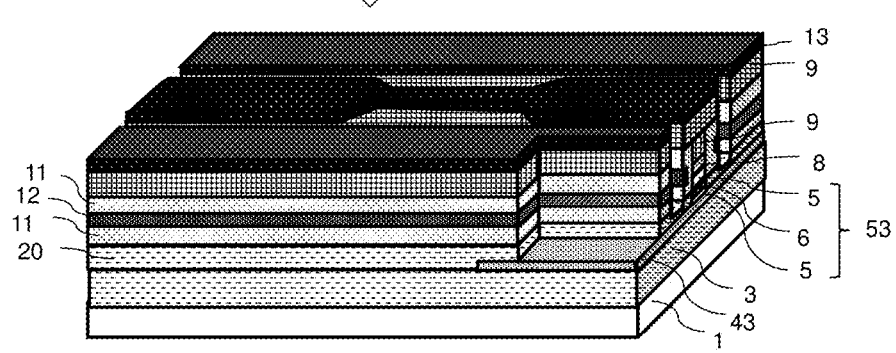
FIGS. 10A and 10B respectively illustrate Step 15 and Step 16 in the semiconductor optical integrated device manufacturing processes according to Embodiment 1.
Figure 10B:
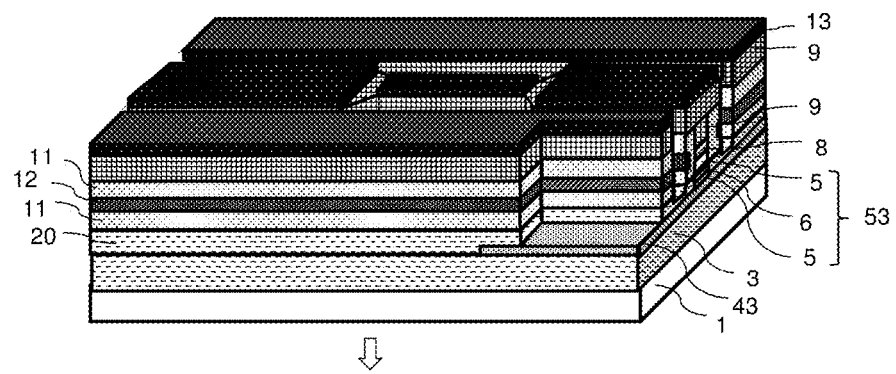
Figure 11A:
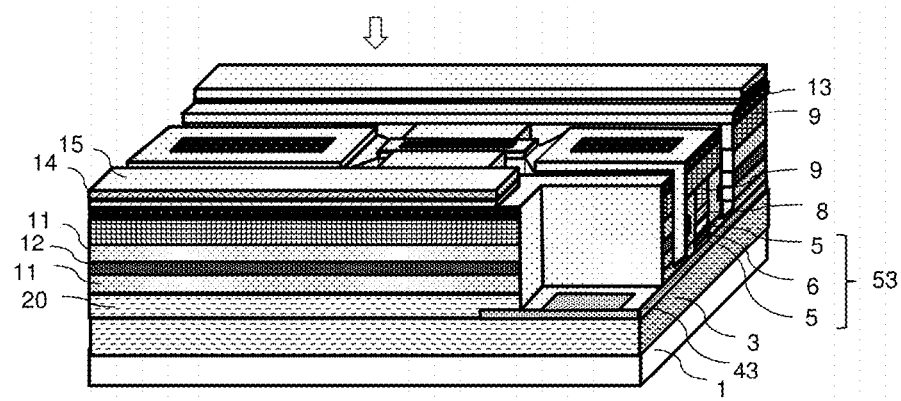
FIGS. 11A and 11B respectively illustrate Step 17 and Step 18 in the semiconductor optical integrated device manufacturing processes according to Embodiment 1.
Figure 11B:
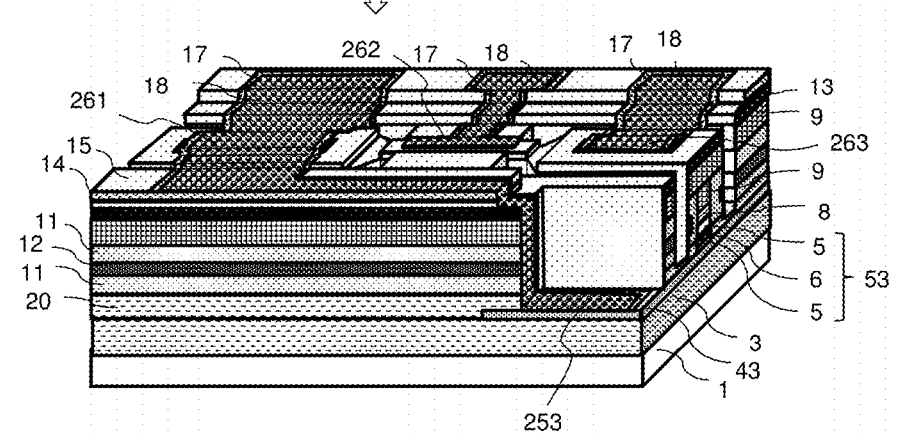

As shown in FIG. 10A, etching of a portion where the n-side contact electrode 253 is to be formed in the region of the semiconductor optical amplifier 103 is performed until the n-InGaAsP contact layer 43 is exposed (Step 15). Thereafter, as shown in FIG. 10B, the p-InGaAs contact layer 13 between the semiconductor laser 101 and the modulator 102 and between the modulator 102 and the semiconductor optical amplifier 103 is etched to securely obtain electrical insulation between them (Step 16). Next, as shown in FIG. 11A, an insulating film 15 is formed on the entire surface, and openings are formed on the p-InGaAs contact layer 13 of the semiconductor laser 101, the modulator 102, and the semiconductor optical amplifier 103, and on the n-InGaAsP contact layer 43 of the semiconductor optical amplifier 103 (Step 17). Finally, as shown in FIG. 11B, by forming electrodes 17 and gold plating layers 18 (Step 18), each of the electrodes 17 and each of the gold plating layers 18 at each of the openings are formed as each of the contact electrodes, and the electrical connection between the p-side contact electrode 261 of the semiconductor laser 101 and the n-side contact electrode 253 of the semiconductor optical amplifier 103 is completed. In this example, the anode of the semiconductor laser 101, that is, the p-side contact electrode 261 on the p-InGaAs contact layer 13 of the semiconductor laser, and the cathode of the semiconductor optical amplifier 103, that is, the n-side contact electrode 253 on the n-InGaAsP contact layer 43 are connected by an electrode 17 and a gold plating layer 18. This is not a limitation, and as shown in the conceptual diagram of FIG. 1, the p-side contact electrode 261 of the semiconductor laser 101 and the n-side contact electrode 253 of the semiconductor optical amplifier may be connected by the wire 27. Finally, the entire wafer is polished to a thickness of about 100 μm, and the n-side contact electrode 25 is formed on the rear surface of the wafer, that is, on the surface opposite to the side on which the devices of the semiconductor substrate 1 are formed.

As described above, in the semiconductor optical integrated device according to Embodiment 1, the conductive semiconductor substrate 1 is used, and the Fe-doped semi-insulating InP layer 3 is provided as an electrically insulating layer between the n-side cladding layer 53 of the semiconductor optical amplifier 103 and the semiconductor substrate 1, and the n-side cladding layer between the semiconductor optical amplifier 103 and the modulator 102 is also replaced with the Fe-doped semi-insulating InP layer 19 serving as the electrically insulating layer. With this configuration, the semiconductor optical amplifier 103 is electrically insulated from the conductive semiconductor substrate 1 and the semiconductor laser 101. Furthermore, the n-side contact layer 43 is provided between the n-side cladding layer 53 of the semiconductor optical amplifier 103 and the Fe-doped semi-insulating InP layer 3, and thereby instead of supplying electric power from the conductive semiconductor substrate 1 to the n-side cladding layer 53, electric power can be supplied to the n-side cladding layer 53 via the n-side contact electrode 253 and the n-side contact layer 43. With this configuration, the semiconductor laser 101 and the semiconductor optical amplifier 103 formed on the same semiconductor substrate 1 can be connected in series, and current from the DC power supply can be reduced. According to this configuration, the series connection can be implemented without increasing the number of driving terminals as compared with the conventional configuration.

In the semiconductor optical integrated device according to Embodiment 1, since the semiconductor laser 101 and the semiconductor optical amplifier 103 are connected in series, the current from the DC power supply can be reduced. Further, since the electrode structure of the integrated semiconductor laser and the modulator are not changed from the conventional structure, the negative electrode side can be connected to the n-side contact electrode 25 on the rear surface of the semiconductor substrate 1 as in the conventional structure, and the conventional driving method can be applied.

Embodiment 2

Figure 12:
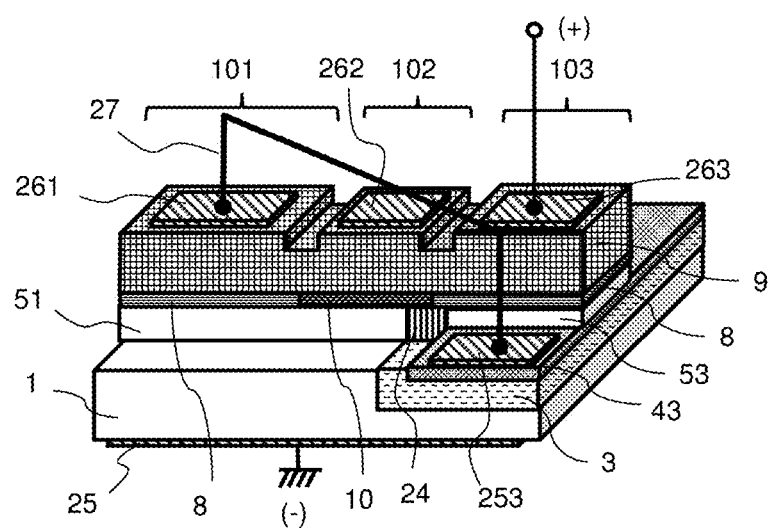
FIG. 12 is a conceptual diagram showing a configuration of a main part of a semiconductor optical integrated device according to Embodiment 2.

FIG. 12 is a conceptual diagram showing a configuration of a main part of a semiconductor optical integrated device according to Embodiment 2. The structure different from that shown in FIG. 1 is that the n-side cladding layer between the modulator 102 and the semiconductor optical amplifier 103 is not an Fe-doped semi-insulating InP layer 19 but a Zn diffusion region 24 which is made p-type by impurity diffusion. As described above, the region between the modulator 102 and the semiconductor optical amplifier 103 may be made of an electrically insulating material, and various semi-insulating semiconductor materials may be used.

Figure 13A:
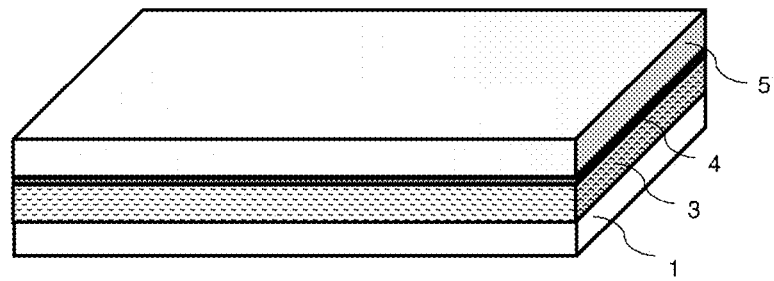
FIGS. 13A and 13B respectively illustrate Step 21 and Step 22 in semiconductor optical integrated device manufacturing processes according to Embodiment 2.
Figure 13B:
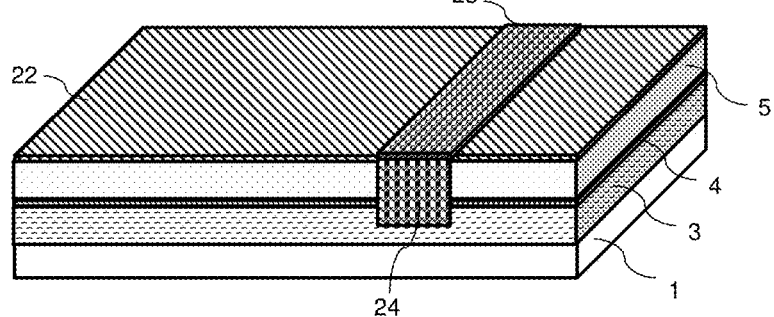
Figure 14A:
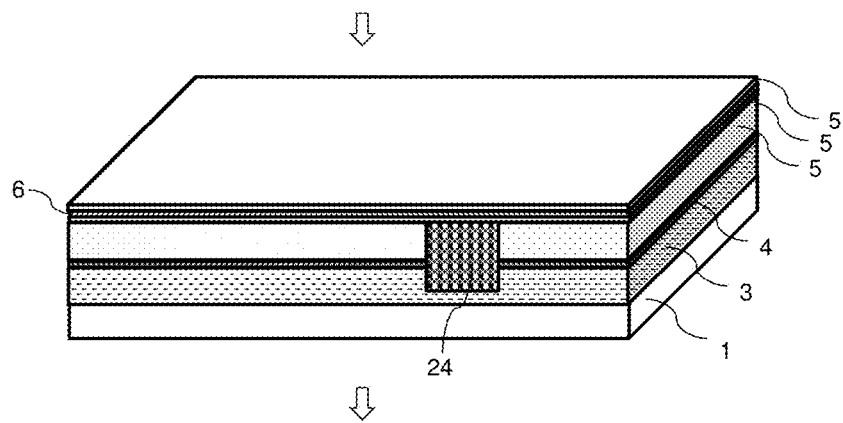
FIGS. 14A and 14B respectively illustrate Step 23 and Step 24 in the semiconductor optical integrated device manufacturing processes according to Embodiment 2.
Figure 14B:
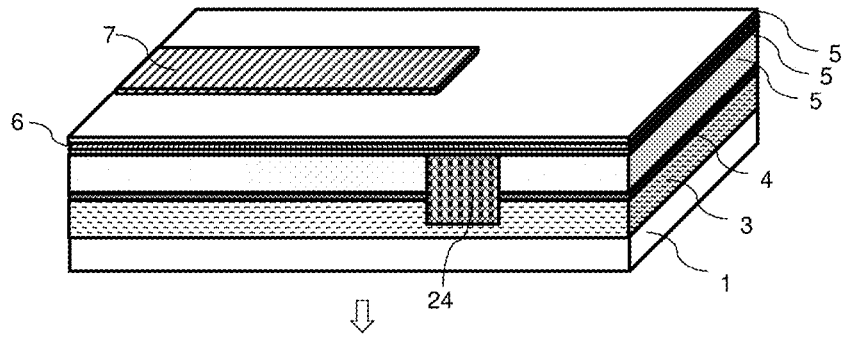
Figure 15A:
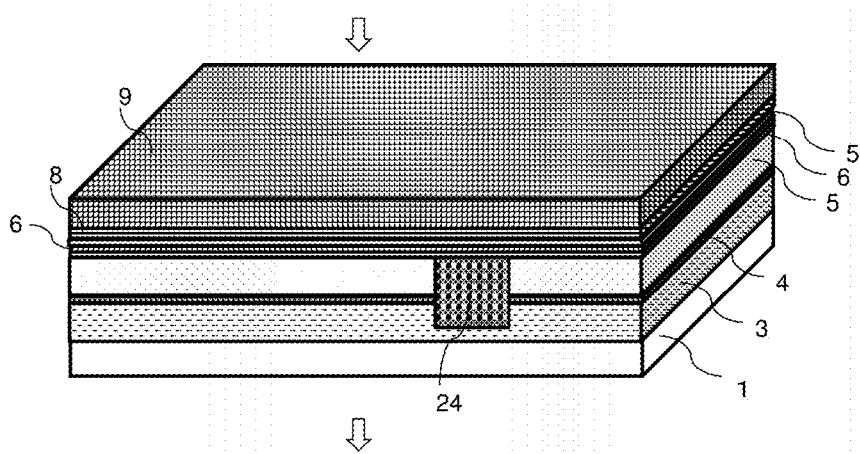
FIGS. 15A and 15B respectively illustrate Step 25 and Step 26 in the semiconductor optical integrated device manufacturing processes according to Embodiment 2.
Figure 15B:
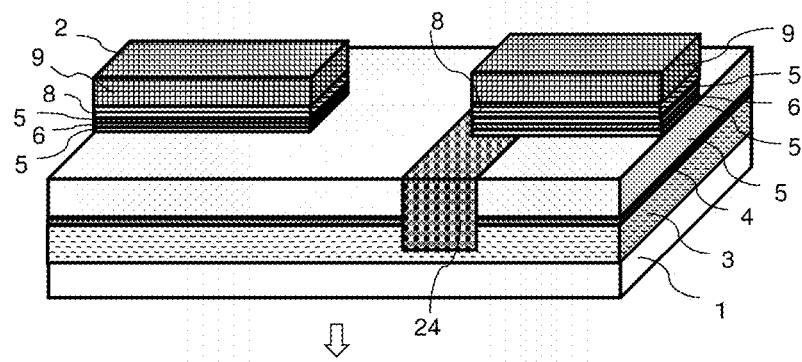
Figure 16A:
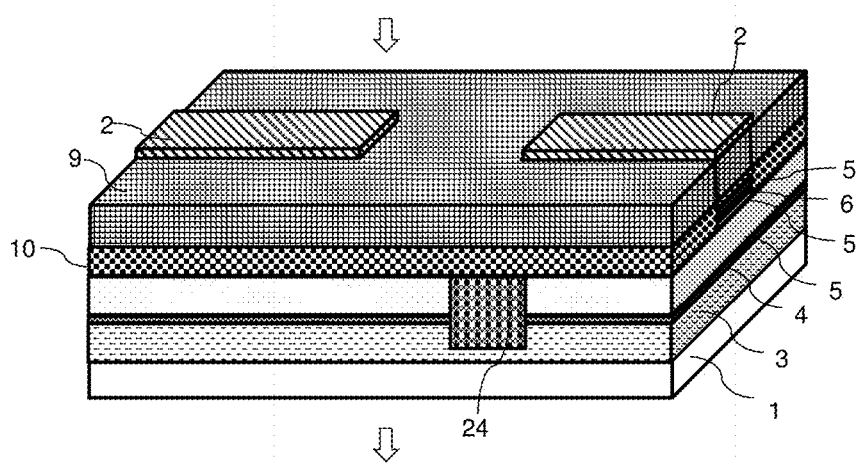
FIGS. 16A and 16B respectively illustrate Step 27 and Step 28 in the semiconductor optical integrated device manufacturing processes according to Embodiment 2.
Figure 16B:
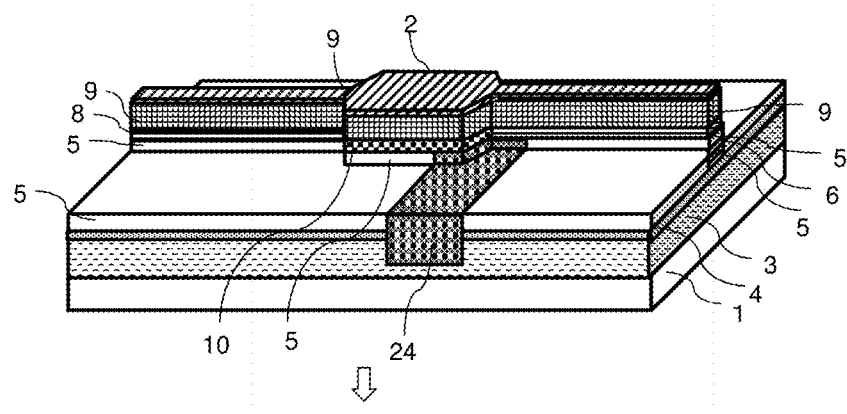

A method of manufacturing the semiconductor optical integrated device shown in FIG. 12 will be described referring to FIGS. 13A and B to FIGS. 16A and B with a focus on processes different from the manufacturing method described in Embodiment 1. First, as shown in FIG. 13A, an Fe-doped semi-insulating InP layer 3, an n-InGaAsP contact layer 4, and an n-InP cladding layer 5 are formed on an n-InP substrate 1 that is a conductive semiconductor substrate (Step 21). Next, as shown in FIG. 13B, an oxide film (ZnO) 23 containing Zn as a p-type dopant is formed between the modulator 102 and the semiconductor optical amplifier 103, and is thermally annealed to thermally diffuse Zn until the Zn reaches the Fe-doped semi-insulating InP layer 3 (Step 22). An area where Zn is diffused is an electrically insulating layer 24. Thereafter, the oxide film (ZnO) 23 containing Zn is removed, and as shown in FIG. 14A, the n-InP cladding layer 5, an n-InGaAsP diffraction grating layer 6, and the n-InP cladding layer 5 are grown on the entire surface (Step 23). Next, as shown in FIG. 14B, the n-InGaAsP diffraction grating layer 6 in a diffraction grating region 7 of the semiconductor laser 101 is etched at a period of 200 nm to form a diffraction grating of the semiconductor laser (Step 24). Thereafter, as shown in FIG. 15A, an active layer 8 and a p-InP cladding layer 9 are formed (Step 25), and as shown in FIG. 15B, an insulating film 2 is formed with a width of several tens of µm so as to have its opening in the region of the modulator 102, and the p-InP cladding layer 9 and the active layer 8 are etched (Step 26). Then, as shown in FIG. 16A, a modulator absorption layer 10 and the p-InP cladding layer 9 are selectively grown on the entire surface (Step 27). Thereafter, the insulating film 2 is removed, and the insulating film 2 is formed again as shown in FIG. 16B, thereby forming a pattern for processing waveguides. The insulating film 2 having about 1 µm in width is formed in the regions of the semiconductor laser 101 and the semiconductor optical amplifier 103 in which both sides of each waveguide are embedded with a semiconductor to form an embedded wave guide, and the insulating film 2 having about several tens of µm in width is formed in the region of the modulator 102 in which the waveguide is formed in shape without covering both sides of the waveguide with a semiconductor (Step 28). Thereafter, etching is performed up to the Zn diffusion region 24 serving as the electrically insulating layer but not up to the n-InGaAsP contact layer 4. The subsequent steps are the same with Step 12 for the embedded growth on both sides of a ridge and its following steps as those described in Embodiment 1.

A major difference from the structure after Step 11 of Embodiment 1 is that the n-side cladding layer between the modulator 102 and the semiconductor optical amplifier 103 is not the Fe-doped semi-insulating InP layer 19 but the Zn diffusion region 24 serving as the electrically insulating layer made p-type by impurity diffusion.

As described above, in the semiconductor optical integrated device according to Embodiment 2, the conductive semiconductor substrate 1 is used, the Fe-doped semi-insulating InP layer 3 serving as the electrically insulating layer is provided between the n-side cladding layer 53 of the semiconductor optical amplifier 103 and the semiconductor substrate 1, and the n-side cladding layer between the semiconductor optical amplifier 103 and the modulator 102 is replaced with the Zn diffusion region 24 serving as the electrically insulating layer made p-type by impurity diffusion. With this configuration, the semiconductor optical amplifier 103 is electrically insulated from the conductive semiconductor substrate 1 and the semiconductor laser 101. Furthermore, the n-side contact layer 43 is provided between the n-side cladding layer 53 of the semiconductor optical amplifier 103 and the Fe-doped semi-insulating InP layer 3, and thereby instead of supplying electric power from the conductive semiconductor substrate 1 to the n-side cladding layer 53, electric power can be supplied to the n-side cladding layer 53 via the n-side contact electrode 253 and the n-side contact layer 43. With this configuration, the semiconductor laser 101 and the semiconductor optical amplifier 103 formed on the same semiconductor substrate 1 can be connected in series, and current from a DC power supply can be reduced. According to this configuration, the series connection can be implemented without increasing the number of driving terminals as compared with the conventional configuration.

In the semiconductor optical integrated device according to Embodiment 2, since the semiconductor laser 101 and the semiconductor optical amplifier 103 are connected in series as in Embodiment 1, the current from the DC power supply can be reduced. Further, since the electrode structure of the integrated semiconductor laser and the modulator are not changed from a conventional structure, the negative electrode side can be connected to the n-side contact electrode 25 on the rear surface of the semiconductor substrate 1 as in the conventional structure, and the conventional driving method can be applied.

Figure 21:
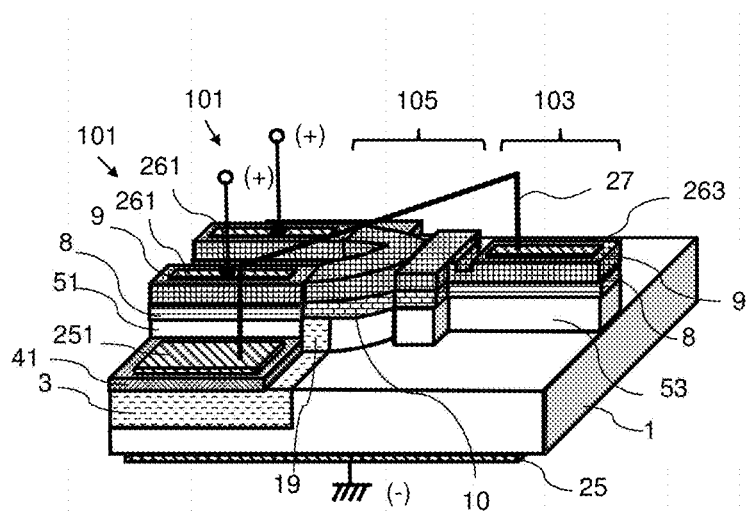
FIG. 21 is a conceptual diagram showing a configuration of a main part of a semiconductor optical integrated device according to Embodiment 4.

As a configuration in both Embodiment 1 and Embodiment 2, as shown in FIG. 21 of Embodiment 4 described later, the Fe-doped semi-insulating InP layer 3 may be provided as an electrically insulating layer between the n-side cladding layer 51 of the semiconductor laser 101 and the conductive semiconductor substrate 1 to electrically separate the semiconductor laser 101 from the semiconductor substrate 1, and an insulating layer such as the Fe-doped semi-insulating InP layer 3 may not be provided between the n-side cladding layer 51 of the semiconductor optical amplifier 103 and the conductive semiconductor substrate 1 to make electrically conductive. In this case, it is needless to say that the semiconductor laser 101 and the semiconductor optical amplifier 103 can be connected in series by providing the n-side contact layer between the n-side cladding layer 51 and the Fe-doped semi-insulating InP layer 3.

Embodiment 3

Figure 17:
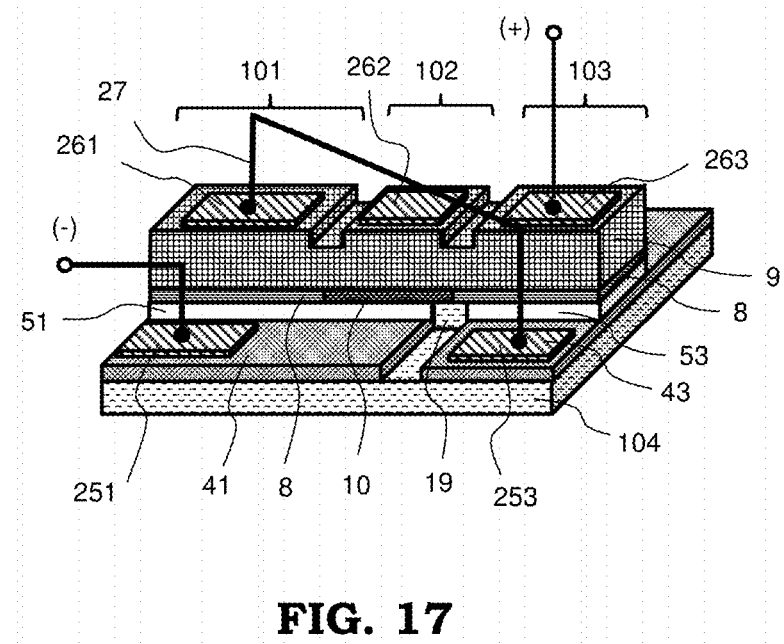
FIG. 17 is a conceptual diagram showing a configuration of a main part of a semiconductor optical integrated device according to Embodiment 3.

FIG. 17 is a conceptual diagram showing a configuration of a main part of a semiconductor optical integrated device according to Embodiment 3. In this configuration, the basic structure of the device is formed on a semi-insulating semiconductor substrate 104.

An n-InGaAsP contact layer that is an n-side contact layer provided on the semi-insulating semiconductor substrate 104 is separated into an n-side contact layer 41 and an n-side contact layer 43 by a space between a modulator 102 and a semiconductor optical amplifier 103. Further, by replacing an n-side cladding layer between the modulator 102 and the semiconductor optical amplifier 103 with a Fe-doped semi-insulating InP layer 19, the cathode portion of the semiconductor optical amplifier 103 is electrically insulated from the semiconductor laser 101 and the modulator 102. The other configuration is the same as that of FIG. 1. Since the cathode is assigned to an n-side contact electrode 251 on the n-side contact layer 41 of the semiconductor laser 101 and the modulator 102, and an n-side contact electrode 253 on the n-side contact layer 43 of the semiconductor optical amplifier 103, the number of power supply terminals is increased by one as compared with that fabricated on the conductive semiconductor substrate 1 of FIG. 1.

An electrical connection of the semiconductor optical integrated device of FIG. 17 will be described. A DC voltage is applied between a p-side contact electrode 263 of the semiconductor optical amplifier 103 and the n-side contact electrode 251 of the semiconductor laser 101 from an external DC power supply (not shown). The n-side contact electrode 253 of the semiconductor optical amplifier 103 and a p-side contact electrode 261 of the semiconductor laser 101 are connected by a conductor such as a wire 27. By this connection, as shown in the equivalent circuit of FIG. 2, the semiconductor laser 101 and the semiconductor optical amplifier 103 are connected in series in the same manner as the semiconductor optical integrated device according to Embodiment 1 of FIG. 1, and current having the same current value flows through the semiconductor laser 101 and the semiconductor optical amplifier 103.

Figure 18A:
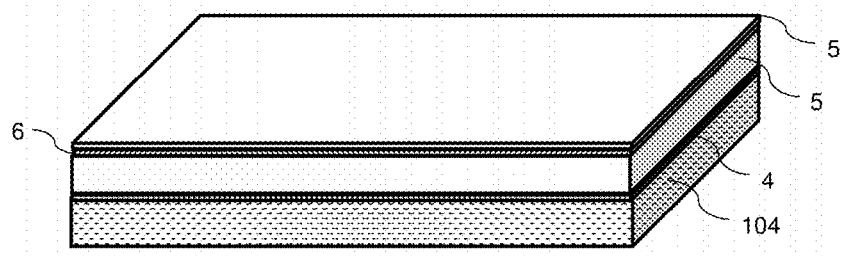
FIGS. 18A and 18B respectively illustrate Step 31 and Step 32 in semiconductor optical integrated device manufacturing processes according to Embodiment 3.
Figure 18B:
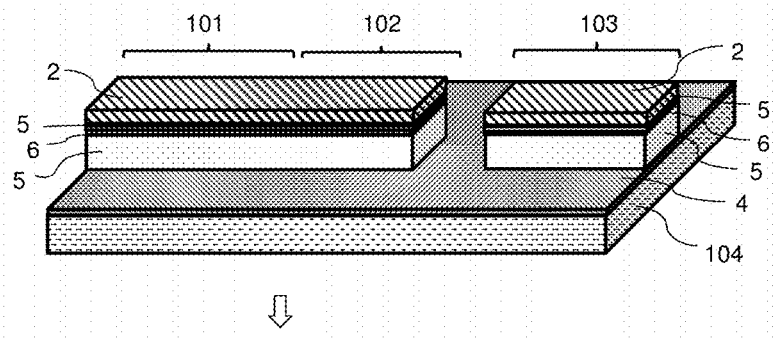
Figure 19A:
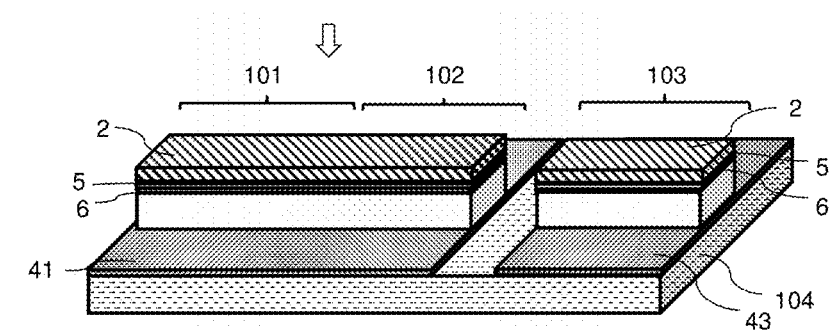
FIGS. 19A and 19B respectively illustrate Step 33 and Step 34 in the semiconductor optical integrated device manufacturing processes according to Embodiment 3.
Figure 19B:
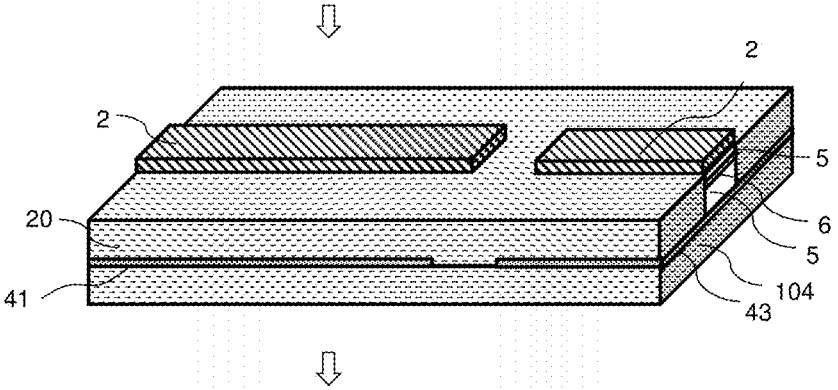

Of the method of manufacturing the semiconductor optical integrated device having the structure shown in FIG. 17, only a part different from the manufacturing method described in Embodiment 1 will be described. As shown in FIG. 18A, an n-InGaAsP contact layer 4, an n-InP cladding layer 5, an n-InGaAsP diffraction grating layer 6 and the n-InP cladding layer are grown on the entire surface of the semi-insulating semiconductor substrate 104 (Step 31). Next, as shown in FIG. 18B, an insulating film 2 is formed with a width of several tens of μm and with an opening of several tens of μm between the modulator 102 and the semiconductor optical amplifier 103, and is etched away until the n-InGaAsP contact layer 4 is exposed (Step 32). Thereafter, as shown in FIG. 19A, the n-InGaAsP contact layer 4 between the modulator 102 and the semiconductor optical amplifier 103 is etched to separate it into the n-side contact layer 41 and the n-side contact layer 43 (Step 33), thereby electrically insulating a n-side of the semiconductor laser 101 and the modulator 102 from a n-side of the semiconductor optical amplifier 103. Next, as shown in FIG. 19B, an Fe-doped semi-insulating InP layer 20 is grown using the insulating film 2 as a mask. The subsequent steps are substantially the same with Step 7 of FIG. 6A in forming the diffraction grating and its following steps described in the first embodiment. However, since the semi-insulating semiconductor substrate 104 is used, the difference is that the n-side contact electrode 251 of the semiconductor laser needs to be provided on the n-side contact layer 41.

Figure 20:
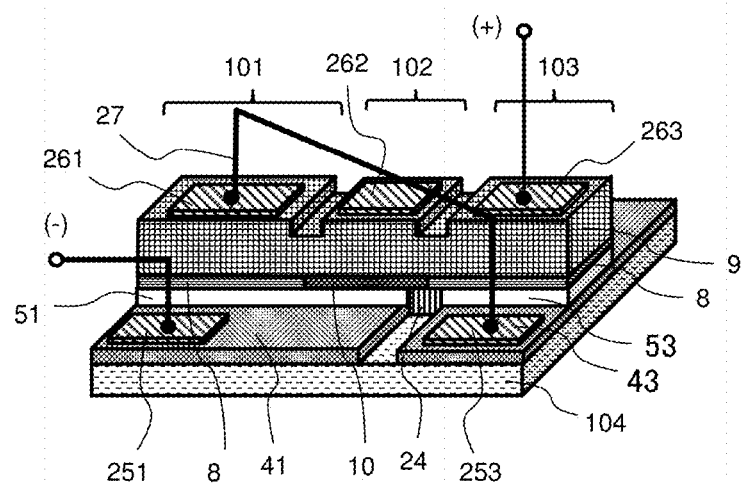
FIG. 20 is a conceptual diagram showing another configuration of a main part of a semiconductor optical integrated device according to Embodiment 3.

FIG. 20 is a conceptual diagram showing another configuration of a main part of a semiconductor optical integrated device according to Embodiment 3. The configuration of the semiconductor optical integrated device of FIG. 20 is similar to the configuration of FIG. 17 in that the basic structure of the device is formed on the semi-insulating semiconductor substrate 104. The difference from the semiconductor optical integrated device shown in FIG. 17 is that a portion of the n-side cladding layer between the modulator 102 and the semiconductor optical amplifier 103 is replaced with a p-type InP layer 24 or is made p-type by impurity diffusion for the electrical insulation.

As described above, the n-side cladding layer between the modulator 102 and the semiconductor optical amplifier 103 can be replaced with the Fe-doped semi-insulating InP layer 19 or with a Zn diffusion region 24 made p-type by impurity diffusion. For the fabrication, in the case of the Fe-doped semi-insulating InP layer 19, the steps described in Embodiment 1 can be referred to, and in the case of the Zn diffusion region 24 made p-type by impurity diffusion, the steps described in Embodiment 2 can be referred to.

As described above, in the configuration of the semiconductor optical integrated device according to Embodiment 3, the semi-insulating semiconductor substrate 104 is used, and the portion between the n-side cladding layer 51 of the semiconductor laser 101 and the n-side cladding layer 53 of the semiconductor optical amplifier 103 is formed as an electrically insulating layer of a semi-insulating semiconductor material such as the Fe-doped semi-insulating InP layer 3 or the Zn diffusion region 24 made p-type by impurity diffusion, so that the n-side cladding layer 51 of the semiconductor laser 101 and the n-side cladding layer 53 of the semiconductor optical amplifier 103 are electrically insulated. Furthermore, the n-side contact layer 41 is provided between the n-side cladding layer 51 of the semiconductor laser 101 and the semi-insulating semiconductor substrate 104, the n-side contact layer 43 is provided between the n-side cladding layer 53 of the semiconductor optical amplifier 103 and the semi-insulating semiconductor substrate 104, and each of the n-side contact layers extends laterally to enable electrical connection to each of the n-side cladding layers. With this configuration, the semiconductor laser 101 and the semiconductor optical amplifier 103 that are formed on the same semiconductor substrate 104 can be connected in series.

As in Embodiment 1 and Embodiment 2, since the semiconductor laser 101 and the semiconductor optical amplifier 103 are connected in series, current from the DC power supply can be reduced.

Embodiment 4

FIG. 21 is a conceptual diagram showing a configuration of a main part of a semiconductor optical integrated device according to Embodiment 4. In Embodiment 4, a semiconductor optical integrated device is described in which a plurality of semiconductor lasers 101 and at least one semiconductor optical amplifier 103 are monolithically integrated on the same semiconductor substrate. FIG. 21 shows a configuration example in which two semiconductor lasers 101 are integrated in parallel for simplicity, the outputs of the two semiconductor lasers 101 are combined by an optical multiplexer 105, and then input to a semiconductor optical amplifier 103. In the configuration example shown in FIG. 21, an n-type InP substrate 1 serving as a conductive semiconductor substrate is used as the semiconductor substrate, as in Embodiment 1 or Embodiment 2.

As in FIG. 1, an n-side cladding layer between the semiconductor laser 101 and the optical multiplexer 105 is replaced with an Fe-doped semi-insulating InP layer 19, and an n-side cladding layer 51 of the semiconductor laser 101 and the semiconductor substrate 1 are insulated from each other by an Fe-doped semi-insulating InP layer 3. As a result, the semiconductor laser 101 and the semiconductor optical amplifier 103 are electrically separated at a portion of the n-side cladding layer. An n-side contact layer 41 for electrically connecting to the n-side cladding layers 51 of the two semiconductor lasers 101 is provided as the n-side contact layer 41 common to both semiconductor lasers 101. An n-side contact electrode 251 is provided on the n-side contact layer 41. In the configuration, p-side contact electrodes 261 of the semiconductor lasers 101 are used as anodes of the devices, and an n-side contact electrode 251 of the semiconductor lasers 101 and a p-side contact electrode 263 of the semiconductor optical amplifier 103 are electrically connected by a wire 27. The connection structure is not limited to the structure in which the wire 27 is provided, but may be the structure in which the connection is made by metal on the chip.

As in Embodiment 2, that is, in the case of the semiconductor optical integrated device shown in FIG. 12, a portion of the n-side contact layer between the semiconductor laser 101 and the optical multiplexer 105 may be replaced with a p-type InP layer, or may be formed into a p-type layer by impurity diffusion for the electrical insulation.

As the configuration, the conductive semiconductor substrate 1 is used, the Fe-doped semi-insulating InP layer 3 is provided as the electrically insulating layer between the n-side cladding layer 51 of the semiconductor laser 101 and the semiconductor substrate 1, and the n-side cladding layer between the semiconductor laser 101 and the optical multiplexer 105 is also replaced with an electrically insulating layer such as the Fe-doped semi-insulating InP layer 19 or the p-type InP layer 24, thereby electrically insulating the semiconductor laser 101 from the conductive semiconductor substrate 1. With this configuration, by electrically connecting the p-side cladding layer 9 of the semiconductor optical amplifier 103 and the n-side cladding layer 51 of the semiconductor laser 101, the semiconductor laser 101 and the semiconductor optical amplifier 103 that are formed on the same semiconductor substrate 1 can be connected in series, and drive current from a DC power supply can be reduced. Since a semi-insulating substrate is not used, the number of driving terminals is not increased as compared with the conventional one.

The semiconductor optical integrated device having the configuration shown in FIG. 21 can reduce the drive current. Further, since the semiconductor laser 101 and the semiconductor optical amplifier 103 are connected in series, only one driving terminal is needed on the upper surface of the substrate.

Figure 22:
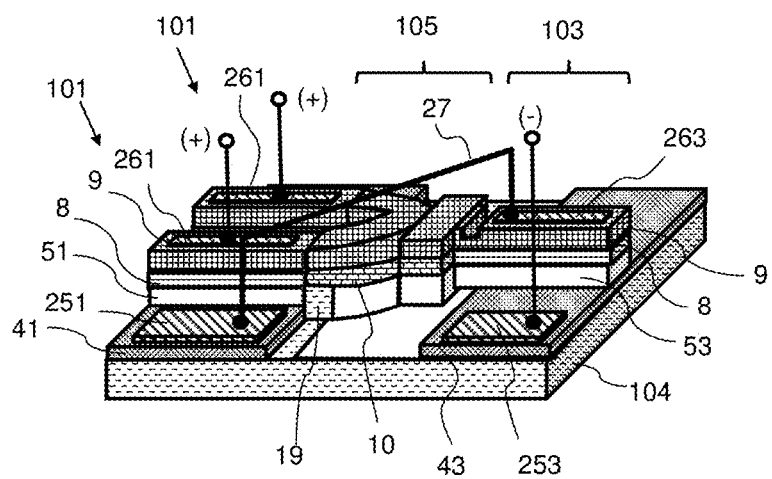
FIG. 22 is a conceptual diagram showing a configuration of a main part of the semiconductor optical integrated device according to Embodiment 4.

FIG. 22 is a conceptual diagram showing another configuration of a main part of a semiconductor optical integrated device according to Embodiment 4. The semiconductor optical integrated device shown in FIG. 22 has substantially the same basic structure as the semiconductor optical integrated device shown in FIG. 21, and is a semiconductor optical integrated device in which a plurality of semiconductor lasers 101 and at least one semiconductor optical amplifier 103 are monolithically integrated on the same semi-insulating semiconductor substrate 104 as described in Embodiment 3. As in Embodiment 3, the n-side contact layer 41 is provided between the n-side cladding layer 51 of the semiconductor laser 101 and the semi-insulating semiconductor substrate 104, an n-side contact layer 43 is provided between the n-side cladding layer 53 of the semiconductor optical amplifier 103 and the semi-insulating semiconductor substrate 104, and each of the n-side contact layers extends laterally to enable electrical connection to each of the n-side cladding layers. Note that the n-side contact layer 41 is provided in common to the plurality of semiconductor lasers 101. Also with this configuration, by electrically connecting the p-side cladding layer 9 of the semiconductor optical amplifier 103 and the n-side cladding layer 51 of the semiconductor laser 101, the semiconductor laser 101 and the semiconductor optical amplifier 103 that are formed on the same semi-insulating semiconductor substrate 104 can be connected in series, and the drive current can be reduced. However, since the semi-insulating substrate is used, the number of terminals is increased as compared with the configuration of FIG. 21.

Embodiment 5

Figure 23:
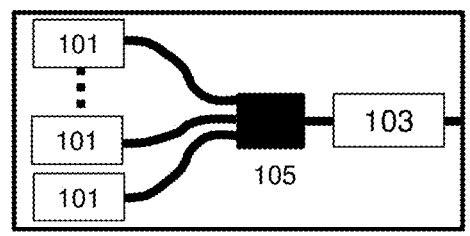
FIG. 23 is a block diagram showing a schematic configuration of a semiconductor optical integrated device according to Embodiment 5.
Figure 24:
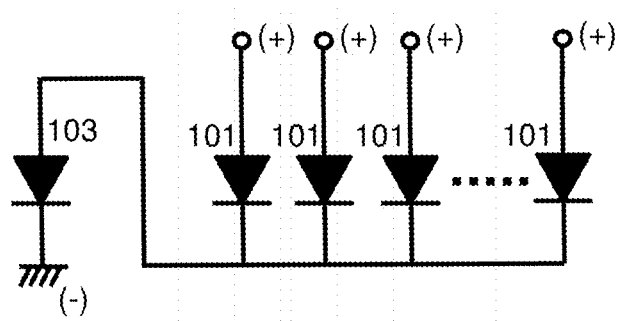
FIG. 24 is an equivalent circuit diagram for explaining an electrical connection of the configuration of FIG. 23 in the semiconductor optical integrated device according to Embodiment 5.

FIG. 23 is a block diagram showing a schematic configuration of a semiconductor optical integrated device according to Embodiment 5. In the semiconductor optical integrated device according to Embodiment 4, that is, the configuration shown in FIGS. 21 and 22, the configuration with two semiconductor lasers 101 is described, but the number of semiconductor lasers is not limited to two. FIG. 23 is a block diagram of a semiconductor optical integrated device in which outputs of a plurality of semiconductor lasers 101 are combined by an optical multiplexer 105 on a semiconductor substrate, and then input to a semiconductor optical amplifier 103. FIG. 24 shows an electrical equivalent circuit when the plurality of semiconductor lasers 101 and the semiconductor optical amplifier 103 are connected in series in the configuration of FIG. 23. In the plurality of semiconductor lasers 101, for example, in order for one of the plurality of semiconductor lasers 101 that have different wavelengths of laser outputs to be selectively driven, a configuration is adopted such that the cathodes of the semiconductor lasers 101 and the cathode of the semiconductor optical amplifier 103 are electrically insulated and the cathodes of the semiconductor lasers 101 and the anode of the semiconductor optical amplifier 103 are electrically connected.

Figure 25:
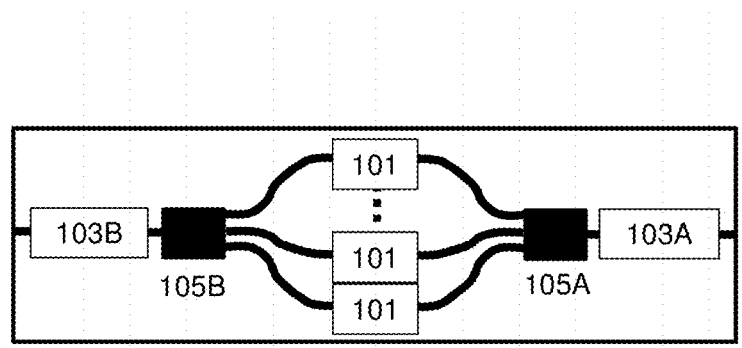
FIG. 25 is a block diagram showing another schematic configuration of the semiconductor optical integrated device according to Embodiment 5.
Figure 26:
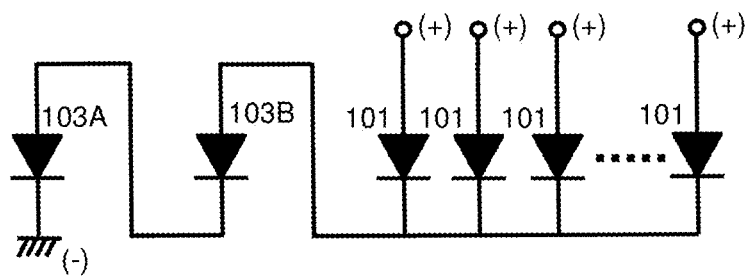
FIG. 26 is an equivalent circuit diagram for explaining an electrical connection of the configuration of FIG. 25 in the semiconductor optical integrated device according to Embodiment 5.
Figure 27:
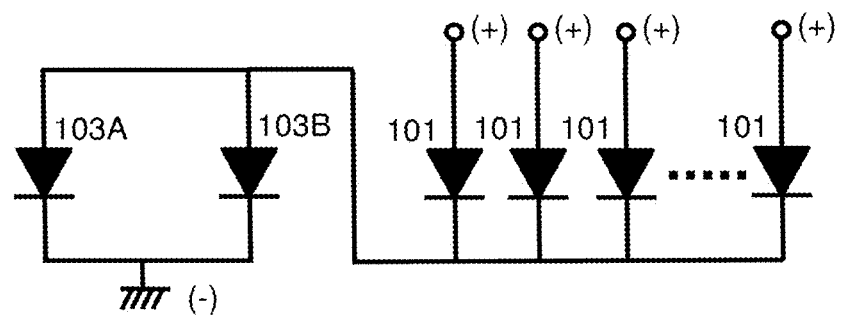
FIG. 27 is an equivalent circuit diagram illustrating another electrical connection of the configuration of FIG. 25 in the semiconductor optical integrated device according to Embodiment 5.

FIG. 25 is a block diagram of an integrated device in which outputs of the plurality of semiconductor lasers 101 are combined by an optical multiplexer 105A and an optical multiplexer 105B on the same semiconductor substrate, and are input to a semiconductor optical amplifier 103A and a semiconductor optical amplifier 103B, respectively. FIG. 26 is an equivalent circuit in a case where two semiconductor optical amplifiers 103A and 103B are connected in series, and the series member of these semiconductor optical amplifiers 103A and 103B and a semiconductor laser 101 are connected in series. Further, FIG. 27 is an equivalent circuit in a case where two semiconductor optical amplifiers 103A and 103B are connected in parallel, and the parallel member of these semiconductor optical amplifiers 103A and 103B and a semiconductor laser 101 are connected in series. The configuration is such that, in FIG. 24, FIG. 26, and FIG. 27, the cathodes of the semiconductor lasers 101 and the cathodes of the semiconductor optical amplifier 103A and the semiconductor optical amplifier 103B are electrically insulated by any of the insulation structures described in Embodiments 1 to 4, and in the case of FIG. 26, the cathode of the semiconductor optical amplifier 103A and the cathode of the semiconductor optical amplifier 103B are also electrically insulated.

Referring to the insulating structures of Embodiments 1 to 4, it can be seen that a configuration in which the plurality of semiconductor optical amplifiers are connected in series as shown in FIG. 26 is also possible. Similarly, it can be seen that a configuration in which a plurality of semiconductor lasers are connected in series is possible.

In summary, the semiconductor optical integrated device disclosed in the present application includes a first semiconductor optical device and a second semiconductor optical device that are monolithically integrated on the same semiconductor substrate, and are configured such that holes are injected from a p-side cladding layer and electrons are injected from a n-side cladding layer into an active layer, wherein the n-side cladding layer of the first semiconductor optical device and the n-side cladding layer of the second semiconductor optical device are electrically insulated;

an n-side contact layer for electrically connecting to the n-side cladding layer of at least one of the first semiconductor optical device and the second semiconductor optical device is provided between the n-side cladding layer of the one and the semiconductor substrate;

the n-side contact layer is electrically connected to the p-side cladding layer of a semiconductor optical device different from the semiconductor optical device provided with the n-side contact layer of the one; and the first semiconductor optical device and the second semiconductor optical device are electrically connected in series.

Thus, the current capacity of a DC power supply can be reduced. Note that each of the first semiconductor optical device and the second semiconductor optical device may be a semiconductor laser or a semiconductor optical amplifier as long as it is configured such that holes are injected from the p-side cladding layer and electrons are injected from the n-side cladding layer into the active layer.

Although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

REFERENCE SIGNS LIST

1 semiconductor substrate (n-InP substrate)
3 electrically insulating layer (Fe-Doped semi-insulating InP layer)
51, 53 n-side cladding layer (n-InP cladding layer)
8 active layer
9 p-side cladding layer (p-InP cladding layer)
19 electrically insulating layer (Fe-Doped semi-insulating InP layer)
24 electrically insulating layer (Zn diffusion region)
25 n-side contact electrode
261, 262, 263 p-side contact electrode
101 semiconductor laser
103 semiconductor optical amplifier

What is claimed is:

1. A semiconductor optical integrated device comprising:
a semiconductor amplifier;
a plurality of semiconductor lasers; and
an optical multiplexer,
wherein the semiconductor amplifier and the plurality of semiconductor lasers are monolithically integrated on one surface of a semiconductor substrate, and the semiconductor amplifier and the plurality of semiconductor lasers are configured such that holes are injected from a p-side cladding layer and electrons are injected from a n-side cladding layer into an active layer;
the semiconductor substrate is a conductive semiconductor substrate;
the n-side cladding layer of the semiconductor amplifier and the n-side cladding layer of each of the plurality of semiconductor lasers are electrically insulated by a first electrically insulating layer formed between the semiconductor substrate and the n-side cladding layer of each of the plurality of semiconductor lasers and a second electrically insulating layer formed between the n-side cladding layer of the semiconductor amplifier and the n-side cladding layer of each of the plurality of semiconductor lasers;
an n-side contact layer for electrically connecting to the n-side cladding layer of each of the plurality of semiconductor lasers is provided between the n-side cladding layer of each of the plurality of semiconductor lasers and the first electrically insulating layer;
the n-side contact layer and the p-side cladding layer of the semiconductor amplifier is configured to be electrically connected;
the semiconductor amplifier and each semiconductor laser of the plurality of semiconductor lasers are electrically connected in series; and
the optical multiplexer is provided between the semiconductor amplifier and the plurality of semiconductor lasers for combining outputs of the plurality of semiconductor lasers to input to the semiconductor amplifier.

2. The semiconductor optical integrated device according to claim 1, wherein an n-side contact electrode to which a negative side of DC power supply is connected is provided on the other surface of the semiconductor substrate; and an p-side contact electrode to which a positive side of DC power supply is connected is provided on the p-side cladding layer of each of the plurality of semiconductor lasers.

3. The semiconductor optical integrated device according to claim 1, wherein the n-side contact layer extends laterally from the n-side cladding layer of one of the plurality of semiconductor lasers.

4. A semiconductor optical integrated device comprising:
a semiconductor amplifier;
a plurality of semiconductor laser; and
an optical multiplexer,
wherein the semiconductor amplifier and the plurality of semiconductor lasers are monolithically integrated on one surface of a semiconductor substrate, and the semiconductor amplifier and the plurality of semiconductor lasers are configured such that holes are injected from a p-side cladding layer and electrons are injected from a n-side cladding layer into an active layer;
the n-side cladding layer of the semiconductor amplifier and the n-side cladding layer of each of the plurality of semiconductor lasers are electrically insulated by an electrically insulating layer that is formed between the n-side cladding layer of the semiconductor amplifier and the n-side cladding layer of each of the plurality of semiconductor lasers and also insulated by the semiconductor substrate being a semi-insulating semiconductor substrate;

an n-side contact layer for electrically connecting to the n-side cladding layer of each of the plurality of semiconductor lasers is provided between the n-side cladding layer of each of the plurality of semiconductor lasers and the semiconductor substrate;

the n-side contact layer and the p-side cladding layer of the semiconductor amplifier is configured to be electrically connected;

the semiconductor amplifier and each semiconductor laser of the plurality of semiconductor lasers are electrically connected in series, and the optical multiplexer is provided between the semiconductor amplifier and the plurality of semiconductor lasers for combining outputs of the plurality of semiconductor lasers to input to the semiconductor amplifier.

5. The semiconductor optical integrated device according to claim 4, wherein the n-side contact layer extends laterally from the n-side cladding layer of one of the plurality of semiconductor lasers.

* * * * *